United States Patent [19]

Garroway et al.

[11] 4,021,726
[45] May 3, 1977

[54] IMAGE FORMATION USING NUCLEAR MAGNETIC RESONANCE

[75] Inventors: Allen Nathan Garroway, Oxon Hill, Md.; Peter Kevin Grannell, Newcastle; Peter Mansfield, Chilwell, both of England

[73] Assignee: National Research Development Corporation, London, England

[22] Filed: Sept. 4, 1975

[21] Appl. No.: 610,436

[30] Foreign Application Priority Data

Sept. 11, 1974 United Kingdom ............ 39625/74
Oct. 31, 1974 United Kingdom ............ 47213/74

[52] U.S. Cl. .......................... 324/.5 A; 324/.5 R
[51] Int. Cl.² ................................. G01R 33/08
[58] Field of Search ............ 324/.5 R, .5 A, .5 B, 324/.5 AC

[56] References Cited

UNITED STATES PATENTS 3,932,805  1/1976  Abe .............................. 324/.5 A

Primary Examiner—Rudolph V. Rolinec
Assistant Examiner—Michael J. Tokar
Attorney, Agent, or Firm—Cushman, Darby & Cushman

[57] ABSTRACT

Nuclear magnetic resonance apparatus designed to enable two and three dimensional images of objects to be obtained has coils for applying a static magnetic field and for applying magnetic gradients to the field in each of three orthogonal directions over the entire volume of a sample and a radio frequency signal generator for applying signals having selected frequency components simultaneously with the magnetic field gradients. In use the spins in all regions of a sample except a slice are saturated or excited in the presence of one magnetic field gradient then a slot in the slice is energized in the presence of a second magnetic field gradient and the free induction decay from the slot read out in the presence of a third gradient. The procedure is repeated for successive slots in a slice and for successive slices.

10 Claims, 17 Drawing Figures

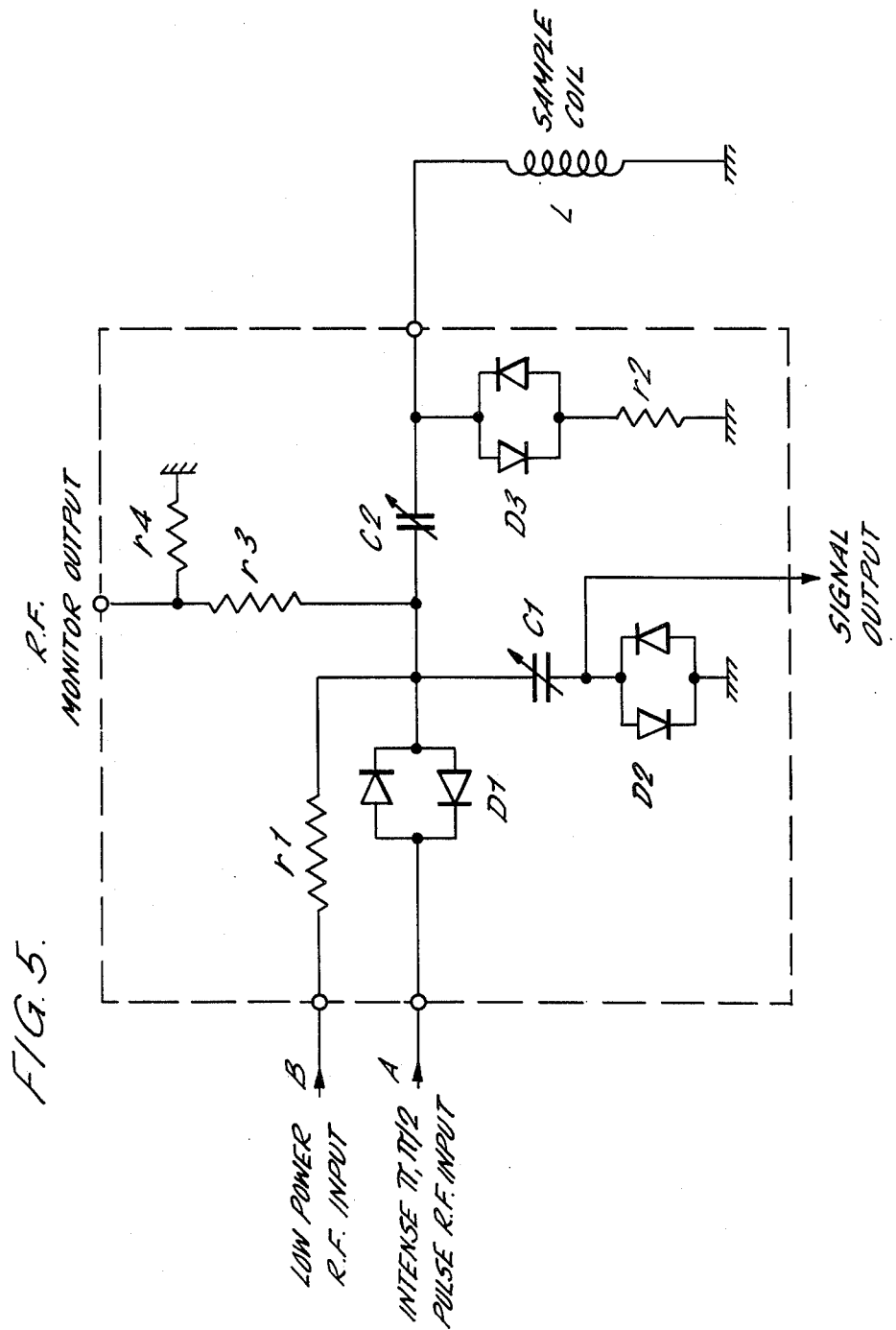

12.4 m.m.

13.9 m.m.

FIG. 12.
(a) DESIRED FOURIER SPECTRUM
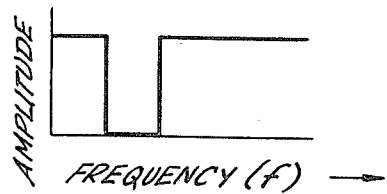
(b) FOURIER TRANSFORM OF DESIRED SPECTRUM
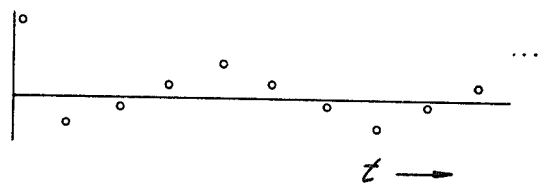
(c) CONVERSION INTO PULSE WIDTHS
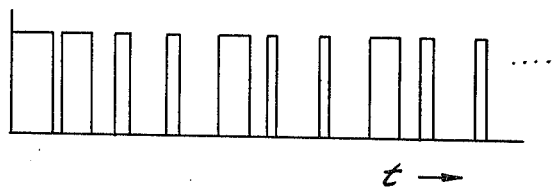
(d) TRIGGER PULSES TO 180° PHASE MODULATION, FIG-3-B2
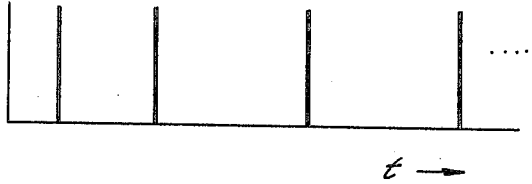
(e) EFFECTIVE R.F. MODULATION
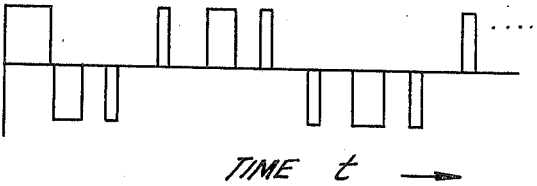

IMAGE FORMATION USING NUCLEAR MAGNETIC RESONANCE

This invention is concerned with the formation of two and three dimensional images of the spin density distribution in materials containing nuclear spins.

Methods have already been proposed for this purpose which make use of nuclear magnetic resonance techniques. In these methods a specimen to be investigated is placed in a magnetic field having a uniform field gradient, so that spatial variations of the spin density along the gradient direction give rise to measurable signal variations in the frequency spectrum derived by a nuclear magnetic resonance experiment. By measuring the frequency spectrum for several orientations of the specimen in the field gradient, it is possible to reconstruct a two or three dimensional image corresponding to the density distribution of the resonant spins in the spectrum. The methods, however, require a lengthy computer calculation and are in principle inexact.

It is therefore an object of the invention to provide an improved method of image formation in which, instead of looking at all the spins in a given sample from various directions as in the methods referred to above, one looks selectively at a specific volume of spins contained within the larger volume of the sample.

In carrying out the invention spatial selectivity is achieved by preparative irradiation of a sample with a radio frequency magnetic field in the presence of a static magnetic field gradient along one direction and then switching the gradient direction before applying an inspection or "read" radio frequency pulse.

An important feature in the preparative irradiation is to tailor the Fourier components of the radio frequency magnetic field so that parts of the spin spectrum are irradiated and others not. Broadly speaking, there are two ways of doing this, which may be termed tailored saturation and tailored excitation.

In tailored saturation the width of the envelope of the preparatory radiation is relatively long, of the order of the spin lattice relaxation time $T_1$, and those irradiated spins have their magnetization destroyed. Tailoring is achieved in this case by frequency and/or amplitude modulation of the pulse envelope. The simplest case of tailored saturation by a radio frequency pulse of fixed amplitude and carrier frequency may be called simple saturation.

In tailored excitation the applied r.f. magnetic field is such that the irradiated spins are tipped into the $x$–$y$ plane, and this may be accomplished more rapidly than in saturation experiments. Tailoring, in this case, is achieved by amplitude or pulsewidth modulation of the radio frequency pulse or pulse train. The simplest case of tailored excitation by the application of an unmodulated radio frequency pulse or pulse train with fixed carrier frequency may be called simple excitation.

In order that the invention may be more fully understood reference will now be made to the drawings accompanying this specification in which.

Figure 3:
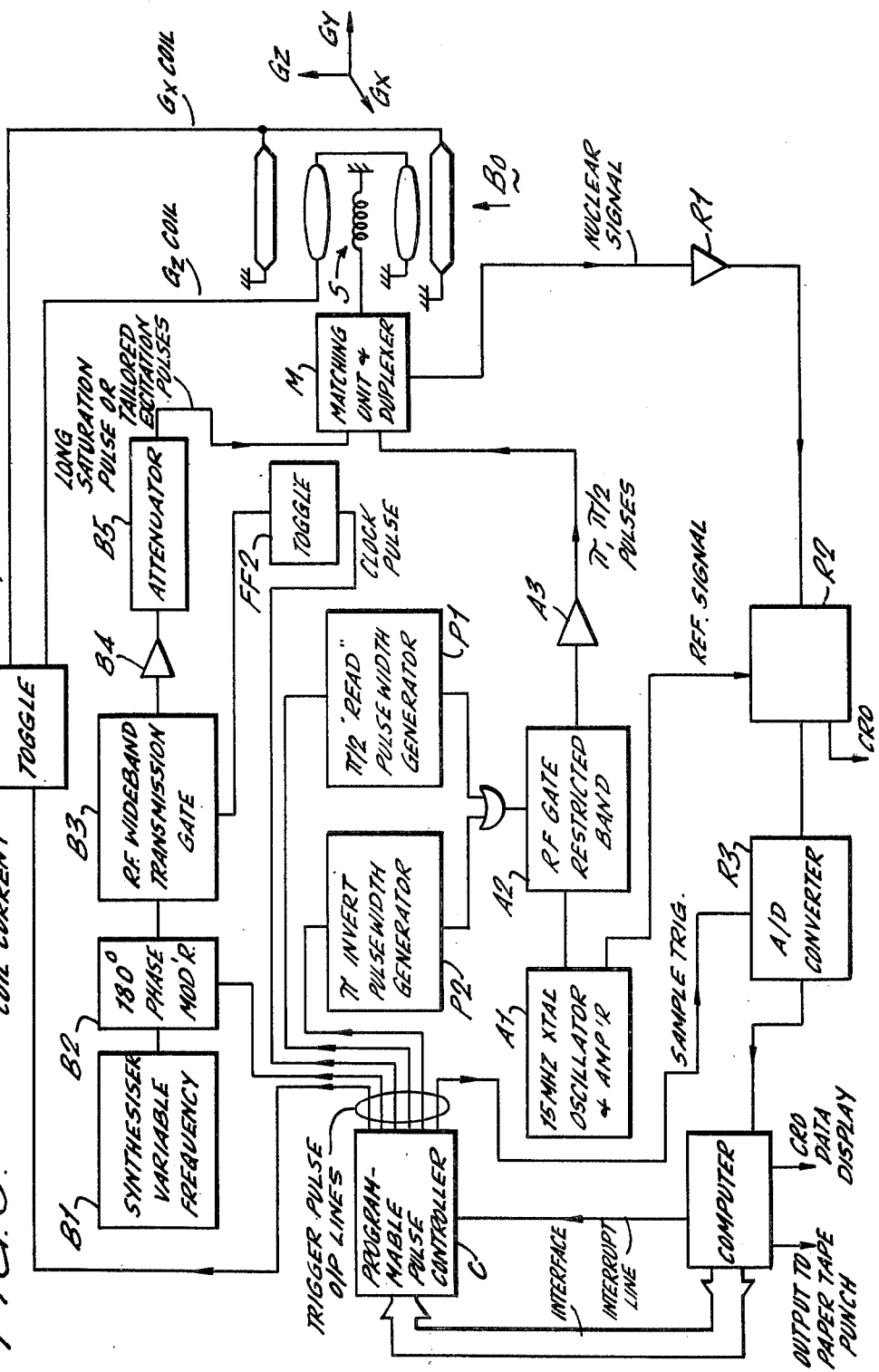
FIG. 3 is a block diagram of NMR apparatus embodying the invention.
Figure 6:
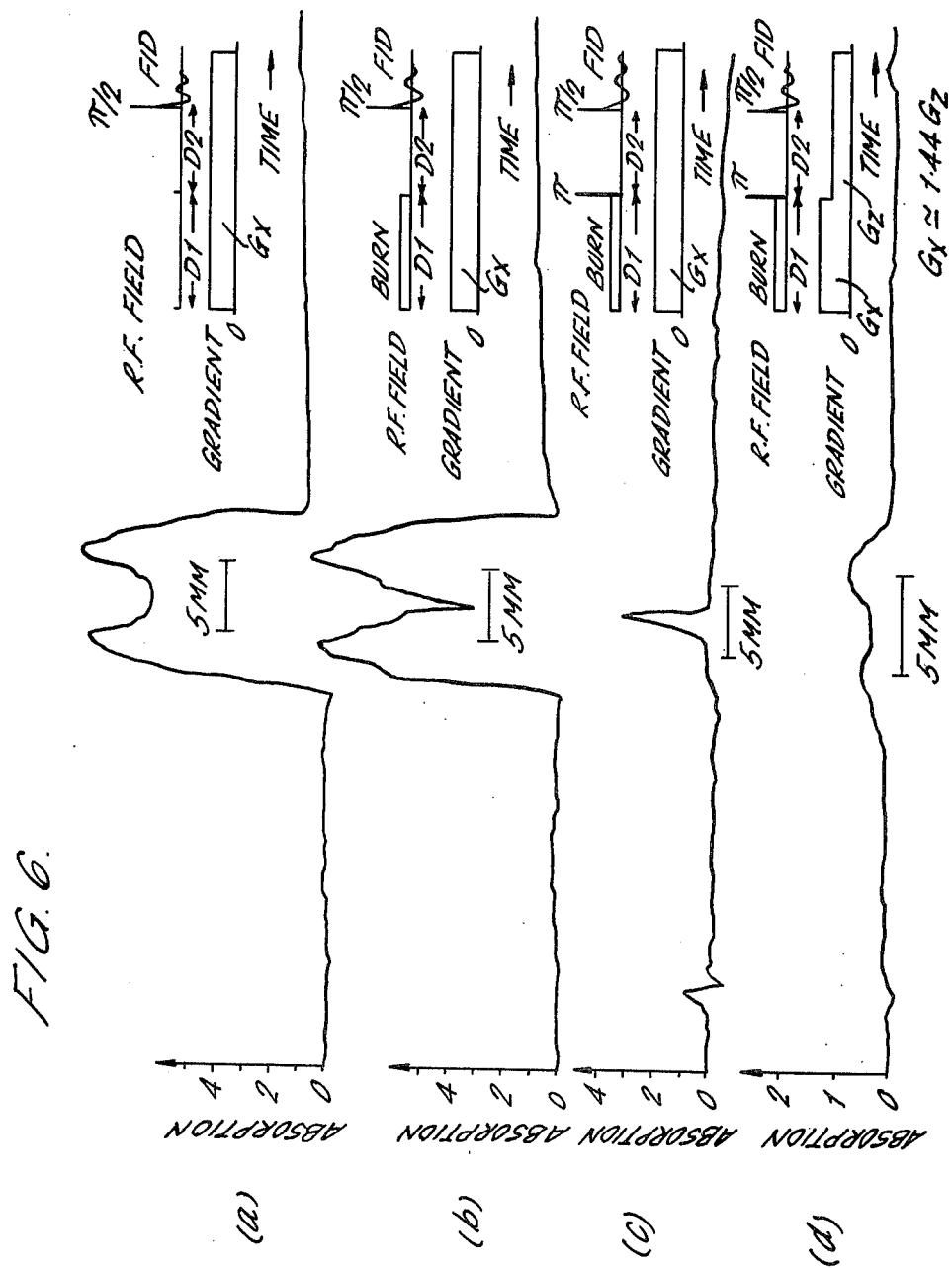
Figure 7:
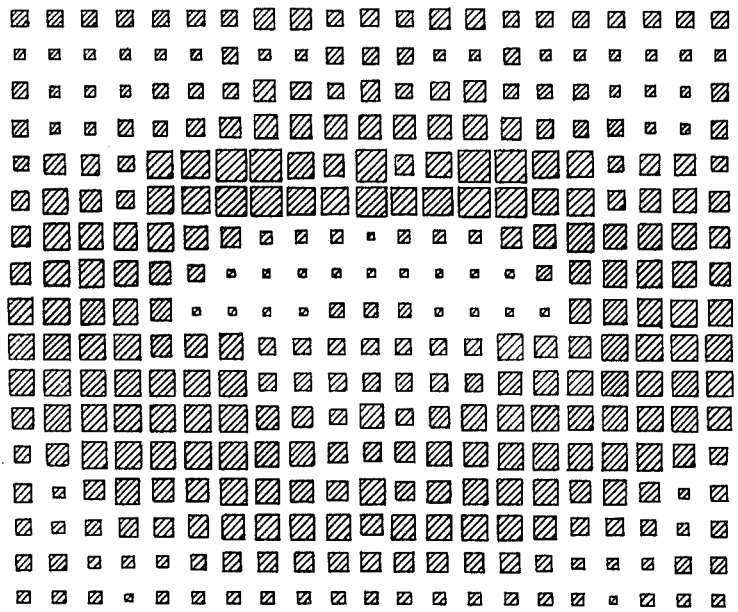
Figure 8:
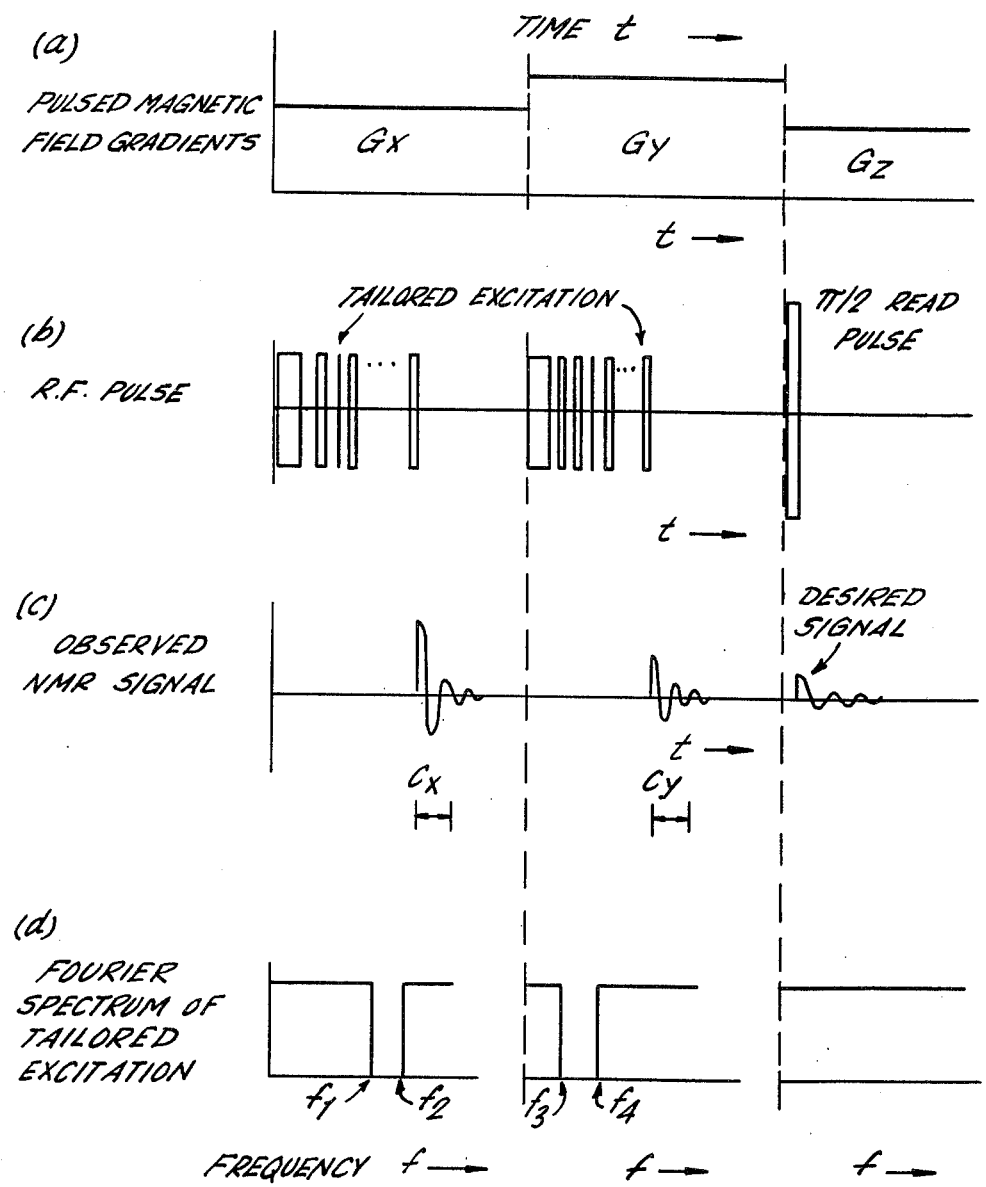
Figure 9:
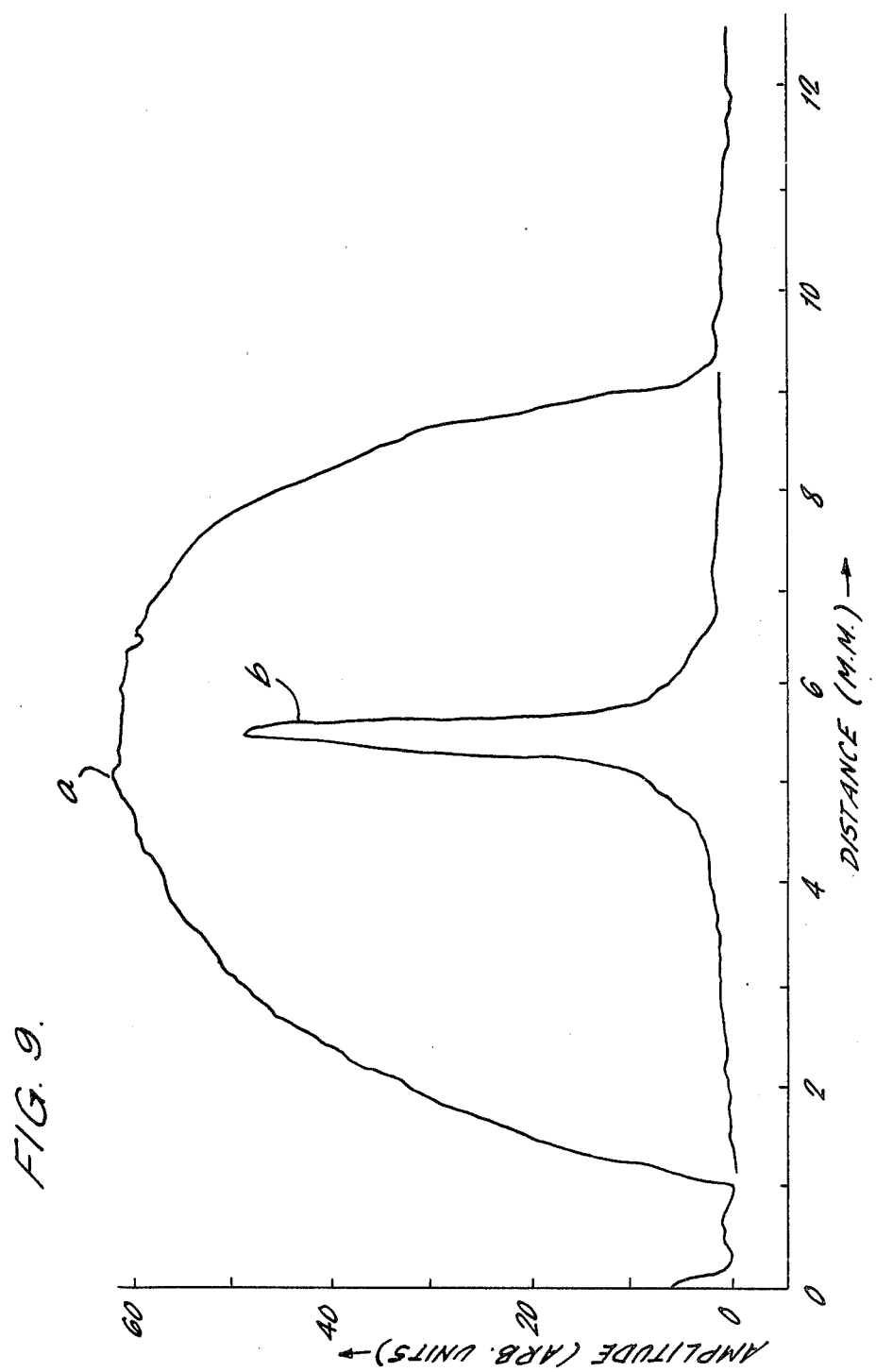
Figure 10:
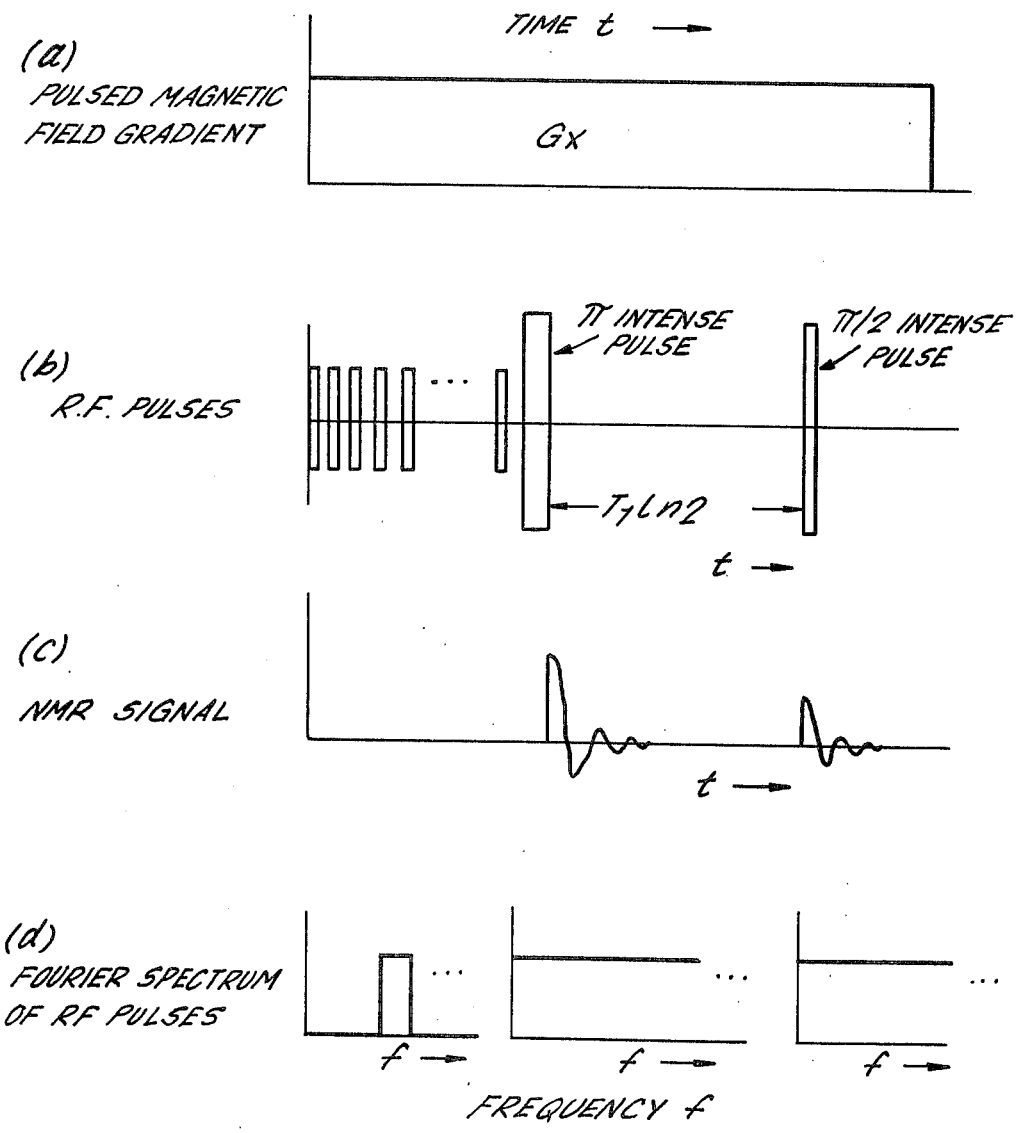
Figure 11:
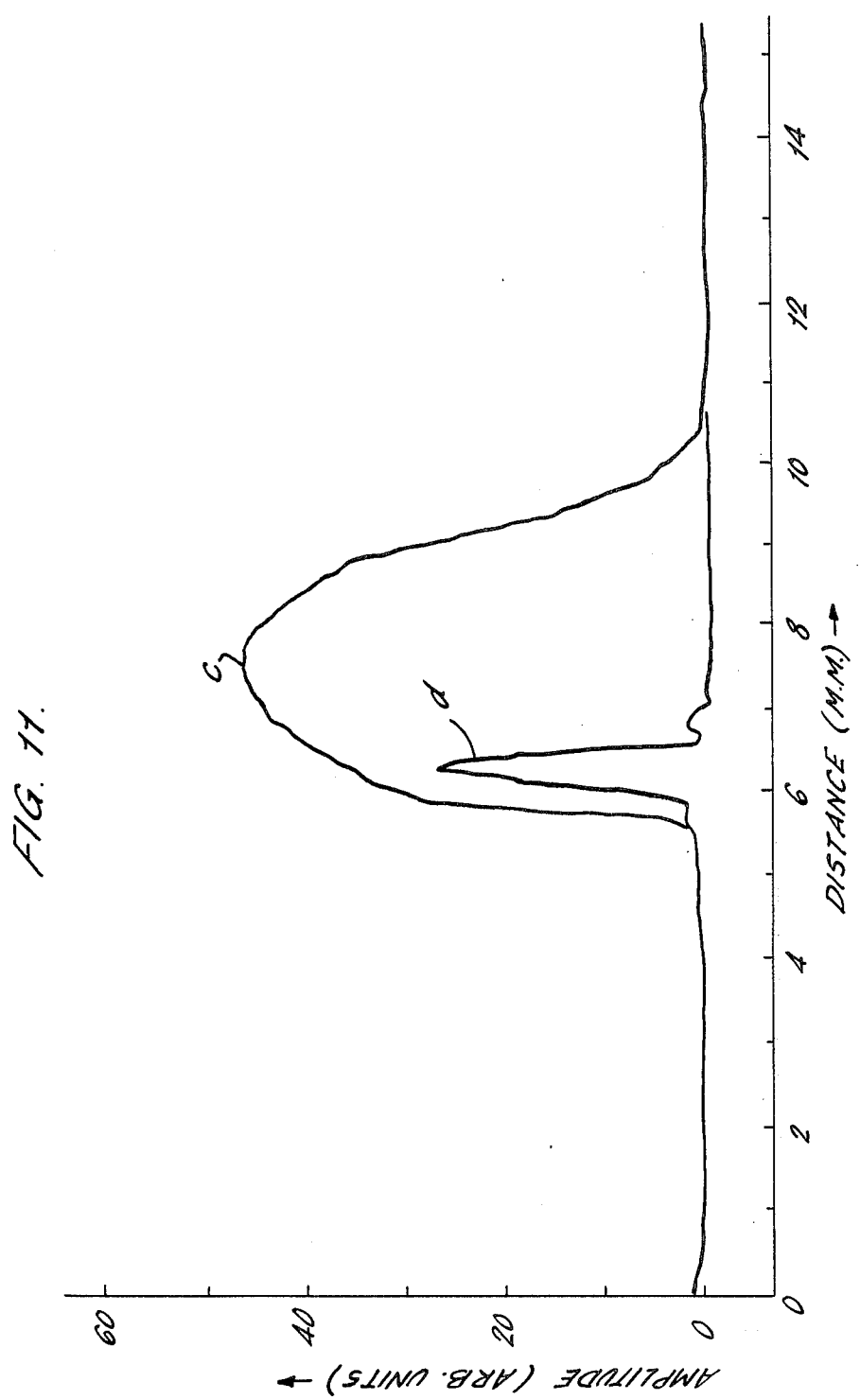
Figure 13:
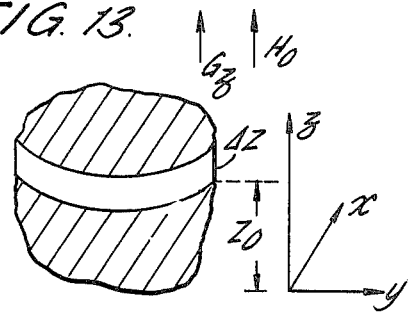
Figure 14:
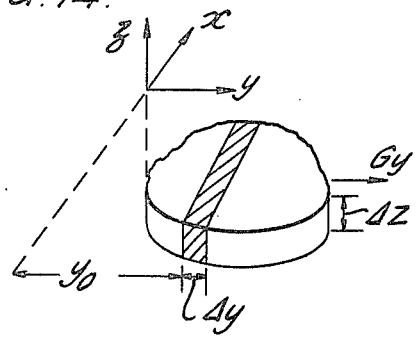
Figure 15:
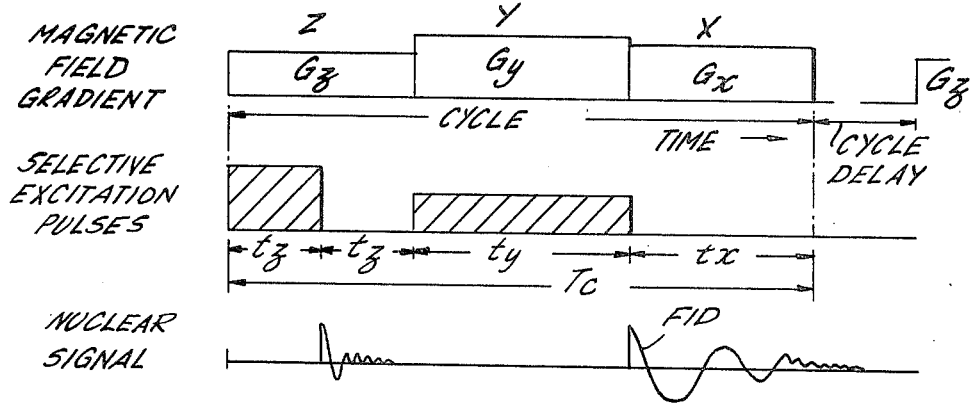
Figure 17:
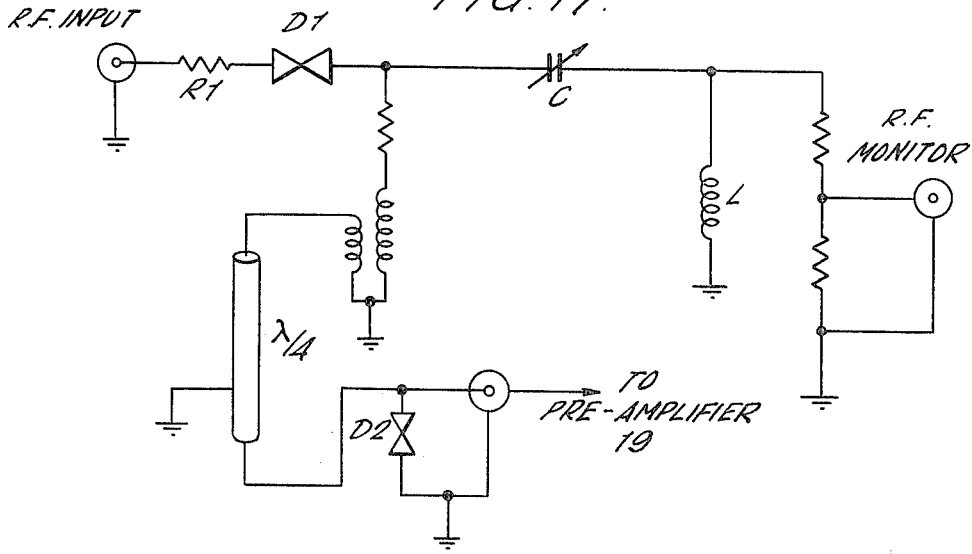
Figure 16:
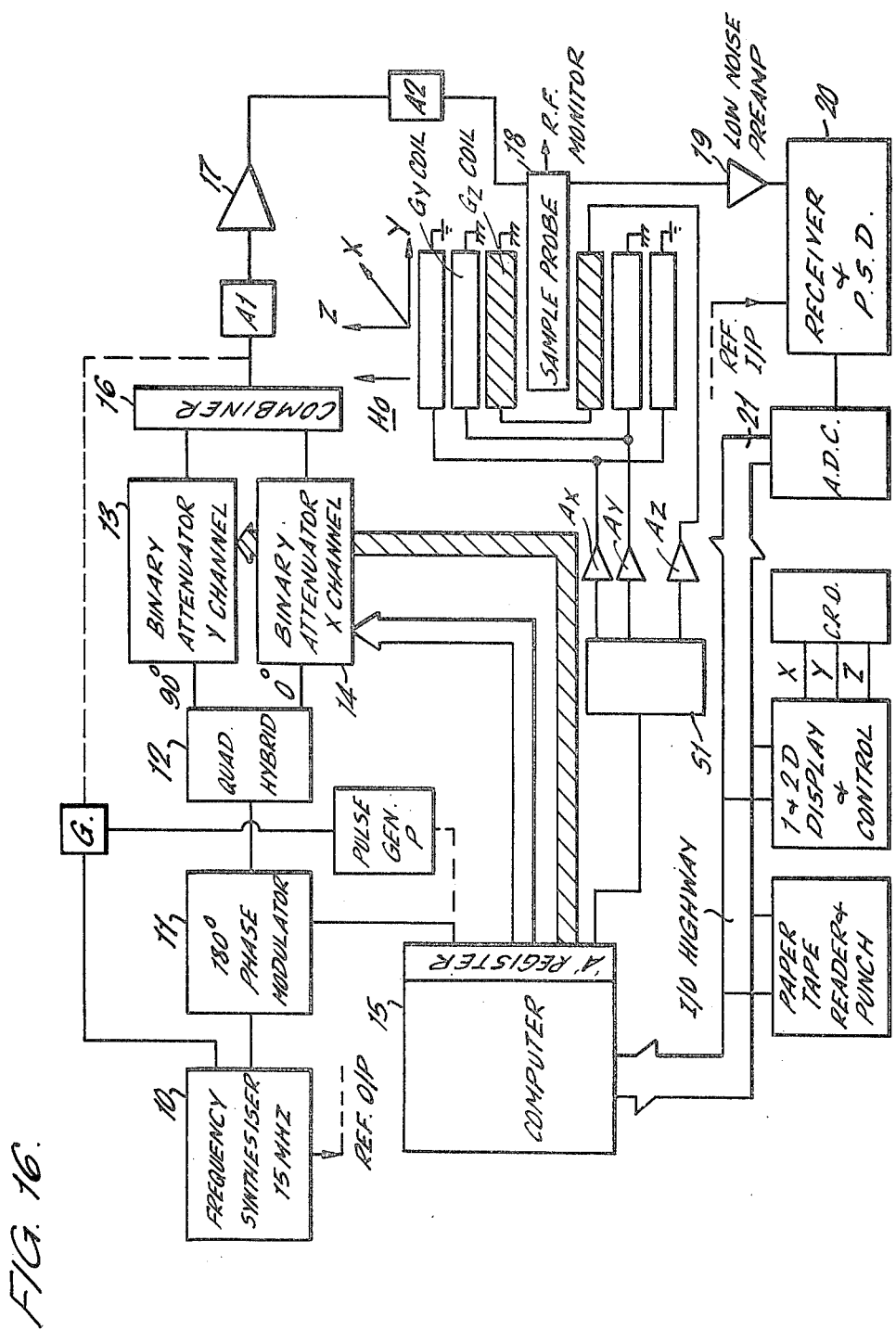

FIG. 5 is a circuit diagram of a matching unit and duplexer used in the apparatus of FIG. 3, FIG. 6 shows at $(a)$, $(b)$, $(c)$ and $(d)$ time varying signals obtained at various stages of an experiment using a saturation technique, FIG. 7 is a picture representing spin density distributions in the above experiment, FIG. 8 shows at $(a)$, $(b)$, $(c)$ and $(d)$ various signals relating to an alternative method embodying the invention using an excitation technique, FIG. 9 shows a demonstration of yet another method of obtaining a spin density distribution, FIG. 10 shows at $(a)$, $(b)$, $(c)$ and $(d)$ various signals relating to an excitation technique alternative to that shown in FIG. 8, FIG. 11 is a graph of output signals obtained by the technique described with reference to FIG. 10 in a single slice and over a whole sample, FIG. 12 shows at $(a)$, $(b)$, $(c)$, $(d)$ and $(e)$ various stages in the generation of an r.f. modulation envelope for an excitation pulse train, FIGS. 13 and 14 are diagram explanatory of one method of carrying out the invention, FIG. 15 shows various signals associated with the method described with reference to FIGS. 13 and 14, FIG. 16 is a block circuit diagram of apparatus embodying the invention, and FIG. 17 is a circuit of an NMR probe that may be used.

Figure 1:
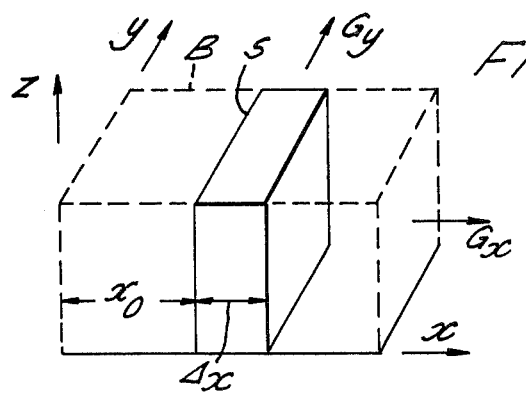
FIGS. 1 and 2 are diagrams explanatory of the invention.

Referring to FIG. 1 consider a block B of spins in a magnetic field initially having a field gradient in an $x$ direction $G_x$, the spin density distribution at a point in the block having co-ordinates $x$, $y$, $z$ being denoted by $\rho(x, y, z)$. A thin slice S in the $y$–$z$ plane of thickness $\Delta x$ and located at $x_o$ is selected and the spin density $\rho(x_o yz)$ is measured. When $\rho(x_o yz) = \rho(x_o y)$, i.e. is independent of $z$, this may be achieved by preparing the sample in the state required by four basic methods set out below, or their variants as follows:

i. saturating all the spins in the block except those in slice S by tailored saturation,
ii. irradiation of all the spins in the block except those in slice S in a transient experiment so that all unwanted spins are tipped into the $x$–$y$ plane, viz tailored excitation.

Rather than affect the spins outside the slice S, complementary experiments may be performed in which the spins within $\Delta x$ are irradiated, for example.

iii. by defining a slot of width $\Delta x$ in the sample by simple saturation; in this case the observed signal arises from the entire sample less the saturated spins within the slot, or
iv. by defining a slot of width $\Delta x$ in the sample by either (a) simple excitation or (b) tailored excitation. In these cases, the transient signal following excitation arises directly from the spins within the defined slot.

Variants of methods (iii) and (iv) allow additional and/or alternative methods of directly observing the initially irradiated spins within the defined slot $\Delta x$. For example, v. by saturating a slot as in (iii), then inverting the whole spectrum by an intense $\pi$r.f. pulse. The saturated spins in the slot will produce a magnetiziation which grows out of the baseline towards the equilibrium value, whereas the main inverted spectrum will relax from an initially negative value, through zero to its positive equilibrium. At the time when the inverted magnetization is zero the remaining magnetization arises only from the spins within the defined slot, or lvi) by defining a slot as (iv), then inverting the whole spectrum by an intense $\pi$r.f. pulse. The initially irradiated spins within the defined slot will produce a magnetization which grows out of the baseline towards the equilibrium value, whereas the main inverted spectrum will relax from an initially negative value, through zero to its positive equilibrium value. At the time when the main inverted magnetization is zero, the remaining magnetization arises only from the spins within the defined slot.

Having prepared the spin system in one of the manners indicated, the direction of the field gradient is quickly switched from $G_x$ to $G_y$, that is to say, from along the $x$ direction to along the $y$ direction. (This may also be achieved by physically rotating the sample through 90°). The spin density distribution in the slab is then "read out" by applying a 90° r.f. pulse. The free induction decay is Fourier transformed to give the spin density $\rho(x_o y)$ along the slab. A c.w. technique could be used here for read out instead of the Fourier transform method.

Figure 2:
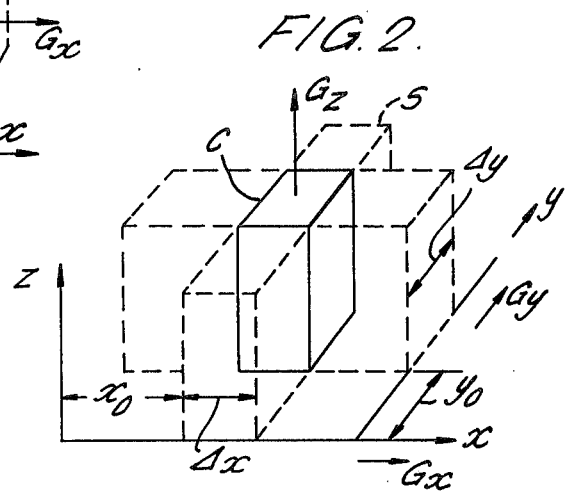

The techniques described above may easily be extended for imaging the spin density in three dimensions. For example having prepared the slab of spins S as described above, one of the selective irradiation procedures as outlined in (i) – (vi) may be applied at right angles, that is, with $G_x = O$ and $G_y$ switched on. The final result is a rectangular column of differentiated spins defined in the sample as sketched in FIG. 2. At this point $G_y$ is switched off and $G_z$ switched on followed by read out as before. The end result is the line density $\rho(x_o, y_o, z)$. The entire procedure may be repeated for all values of $x_o, y_o$, to obtain the full density distribution $\rho(x,y,z)$. The selective irradiative process as described above allows detailed examination of small portions of the sample within a large volume, without the disadvantage suffered by other methods of having to form the full image of the entire object.

The equipment consists basically of two transmitter channels A and B and is shown schematically in FIG. 3. Channel A comprises a continuously running 15 MHz crystal oscillator A1, the output of which is gated through a radio frequency gate A2 of restricted bandwidth. Short pulses of duration of say 6.0 or 12.0 $\mu$sec, corresponding to intense 90° or 180° nutation pulses, are produced after the gate and amplified in a tuned amplifier A3.

The second channel comprises a variable frequency synthesizer B1 set to say approximately 15.0 MHz. The continuous output is fed via a 180° phase modulator B2 to a r.f. wideband transmission gate B3. This produces low power r.f. pulses of varying duration, which are amplified in a wideband r.f. amplifier B4 the output of which is fed through a variable wideband attenuator B5. The outputs of both channels A and B are fed via a matching unit and duplexer M to the sample coil S. The details of the matching unit and duplexer circuit are described below.

Both r.f. channels are controlled by opening and closing their respective gates A2 and B3. Gate A2 is pulsed on by either a 6.0 $\mu$sec 90° pulse or a 180° pulse of around 12.0 $\mu$sec duration from d.c. pulse generators P1 and P2. These in turn are triggered by appropriate timing triggers generated in a programmable pulse controller C.

The 180° phase modulator B2 produces c.w. signals at the output which differ by 180° in r.f. phase, depending on the switched state of the modulator. The switching of the phase modulator state is done by a trigger pulse from pulse controller C. The toggle flip-flop FF2 opens gate B3 for long or short durations, i.e. from a few $\mu$secs through several seconds. The trigger for FF2 also comes from the controller C. The controller's pulse sequence programmes may be loaded directly via programming keys or by punched tape via a teletype, or in the case of tailored excitation, from a computer via an interface.

The transmitter probe and sample coil S sits in a high uniform static magnetic field B, produced by an electromagnet. In addition, linear magnet field gradient coils G surround the sample coil. These gradient coils produce the gradients $G_x$ or $G_y$ and $G_z$. Which coil is activated, and hence which gradient is produced at a particular time depends on the current flowing in each coil. This is controlled by the toggle flip-flop FF1, which activates a read relay which switches current from a power supply through the appropriate coil. Current switching trigger pulses are produced by the pulse controller C.

Figure 4:
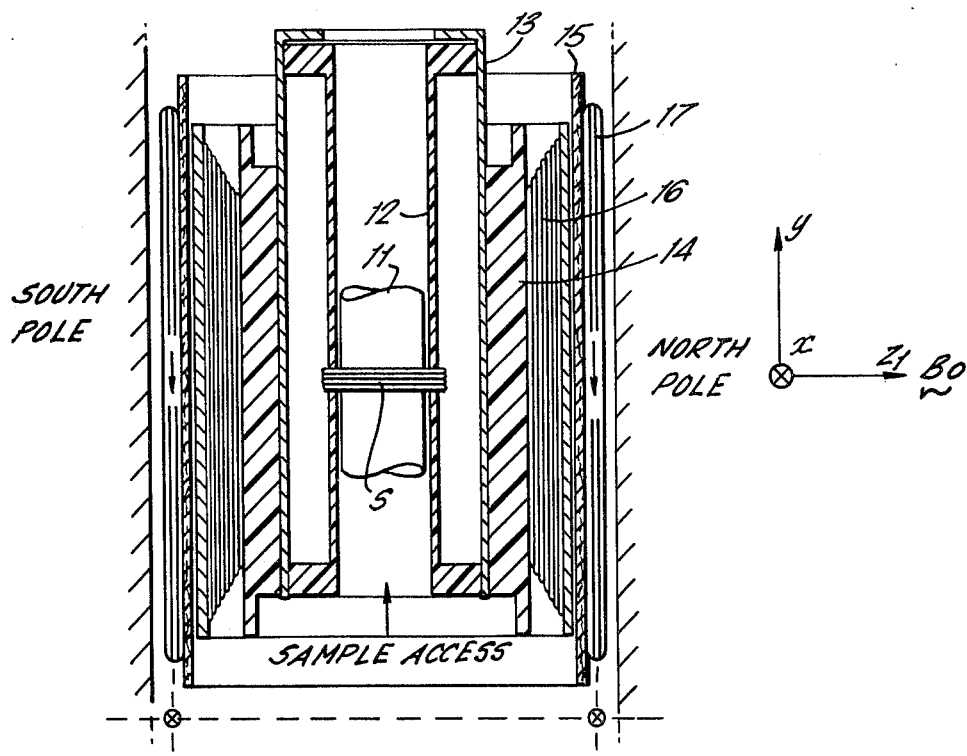
FIG. 4 is a plan view of a probe and field gradient coil assembly.

Details of the gradient coils are as follows: In general three magnetic field gradients are required in these experiments, $G_x = \delta B_z/\delta x$ $G_y = \delta B_z/\delta y$ and $G_z = \delta B_z/\delta z$ FIG. 4 shows the arrangement used to produce two of these gradients $G_z$ and $G_x$, and their disposition with respect to the transmitter probe P and sample and the static field Bo. The gradient $G_z$ is produced by a coil C1 which is wound according to a formula given in Rev. Sci. instr., 36, 1087-7 (1965). The gradients $G_x$ or $G_y$ are produced by the coils C2. These consist essentially of four line currents, with appropriate return paths (not shown in FIG. 4) spaced according to a formula given in J. Phys, E., Scientific Instruments 6, 899–900 (1973).

As shown in FIG. 4 a sample 11 is assessed from below in the FIG. into the sample coil S of 1 – 7 $\mu$H which has 7 turns. The central access aperture is defined by a nylon former 12 surrounded by an aluminum shielding can 13. Surrounding can 13 is a perspex former 14. The coil 16 providing the $G_z$ gradient is wound with 17 turns per side, series connected. The coil 17 providing the $G_x$ gradient comprises 4 strings each of 35 wires per string which are series connected and wound on a former 15.

The circuit details for the matching unit and duplexer are shown in FIG. 5. Channels A and B in FIG. 3 couple to points A and B respectively. The probe consists of a single sample coil L functioning as a transmitter and receiver coil. The matching unit behaves as a parallel tuned circuit for high power. That is say, back-to-back diode pairs D1, D2 and D3 conduct heavily when either channel transmits r.f. power to the probe. Thus C1, C2 and L form a parallel resonant circuit with a parallel damping resistor R2. For signal reception, all diodes behave as open circuits. In this case C1, C2 and L form a series resonant circuit. The resistor R1 of say 12 k ohms in channel B serves to isolate the lower power B channel from the much higher power A channel. The signal, which appears between D2 and C1, is fed through a wideband transformer to a low noise preamplifier.

Nuclear signals generated in the sample coil are directed by the matching unit and duplexer M via a low noise preamplifier R1 to the receiver and phase-sensitive detector R2. Detected signals are digitized in an analogue-to-digital converter (ADC) R3 and fed to a computer, e.g. a Honeywell H316. Signal sampling triggers for the ADC R3 are produced by the pulse controller C. The controller is synchronized with the computer by an interrupt line between computer and controller.

NMR signals may be repetitively averaged in the computer to enhance the signal/noise ratio. The averaged transient signals may be Fourier transformed on line in the computer and then displayed on the CRO display and/or output on to paper tape.

Detailed description of methods (v) and (iii) of the saturation experiments and methods (ii) and (vi) of the excitation experiments are given below.

For method (v) the gradient coils are arranged so that magnetic field gradient $G_x$ is on in the normal state. This may be called the "burn" mode. At the start of the experiment the computer is set into operation to put out an interrupt pulse which causes the controller to enter the control routine for this experiment. The control routine first puts out a trigger to FF2 which switches on the long low level saturation or "burn" pulse of duration D1 (~2.0 secs) in channel B. The spin system is thus locally saturated at a frequency set by the synthesizer B1. This can be varied in a series of experiments to give a frequency scan of the sample. At the end of the "burn" period a second trigger resets FF2 and sets FF1 to give a gradient $G_z$ (the "read" gradient). At the same time the controller puts out a trigger to the 180° pulse generator P2 on the A channel. The intense r.f. pulse thus generated inverts the spin population at time D1. The locally saturated spins will grow to $+ \Delta M_o$ according to $\Delta M(t) = \Delta M(o) (1-\exp(-t/T_1))$ where $T_1$ is the local spin-lattice relaxation time of the spins. The remainder of the spins, since their populations are inverted, will grow back to $+M'(o)$ from their initial value of $-M'(o)$ according to the equation $M'(t) = (M'(o) (1-2 \exp(-t/T_1))$, where $M(o) = M'(o) + \Delta M(o)$. After a further delay $D2 = T_1$ ln 2, the magnetization $M'(D_2) = 0$. However, $\Delta M(D_2)$ is not zero. Thus locally saturated spins are made to yield a signal which is completely differentiated from the remainder of the spins in the sample. At time $D_1 + D_2$, an intense 90° pulse is triggered in channel A by the controller. This inspects or "reads" directly this localized magnetization, but with $G_z$ switched on and $G_x = 0$. Thus a slice 5 of the sample is first isolated using the "burn" gradient $G_x$ and then the spin density distribution along that slice is looked at by switching the gradient to the "read" mode, $G_z$, along the slice.

This procedure may be illustrated experimentally by looking at the protons in a sample of water in the shape of a cylindrical annulus. The signals obtained at various stages of the experiment are presented in FIG. 6. FIG. 6(a) shows the absorption line for the sample in the "burn" gradient. The symmetrical dip in the signal is due to the absence of spins in the central cylindrical occlusion of the sample. FIG. 6(b) shows the result of a 2.0sec saturation "burn" at the centre of the absorption line in FIG. 6(a). FIG. 6(c) shows the signal from the irradiated slice of sample, and was obtained by first "burning" the slot in the centre of the absorption spectrum as in FIG. 6(b), and then inverting the entire spectrum with an intense 180° pulse. The signal was read by an intense 90° pulse applied at time $D_2 = T_1$ 2 later. This time was 0.9 sec in this experiment, and only the $G_x$ gradient was used.

FIG. 6(d) shows the results of the full experiment, method (v), as described previously. The initial "burn" is produced in the sample as above with $G_x$ on. Both the 180° pulse and the "read" gradient $G_z$ are applied. The delay $D2 = T_1$ ln 2 is as for FIG. 6(c) above. After the delay D2, the signal is obtained following the intense 90° "read" pulse. The transient decay signal is Fourier transformed and displayed or put out on a graph plotter. Notice that the experimental absorption line shape obtained comprises two bumps and this is what one expects for the density distribution of a slice taken through the centre of an annulus.

Using data similar to FIG. 6(d) a spin density scan of half the annulus has also been performed using the above method (v). The signals obtained have been made up into a two dimensional dot picture, the area of a given block dot at a particular point in the image being proportional to the signal amplitude of the corresponding point in the sample. Ten grey levels or dot sizes have been used. The data obtained have been reflected about the annulus diameter and the complete picture is shown in FIG. 7. It may be noted that the picture appears elliptical although the object in this case was an annulus of outer diameter 9.7 mm and inner diameter 3.8 mm. The difference in the image axes arises from using different field gradient magnitudes for the "burn" gradient $G_2$, and illustrates a useful feature of the technique, namely that preferential magnification of the image may easily be performed.

In an experiment using the saturation method (ii), the "burn" gradient is set by FF1 and the "burn" pulse applied as for method (v), i.e. for about 2.0secs. At the end of this period the read gradient $G_z$ is quickly applied and $G_x$ set to zero. Shortly after $G_z$ has been switched on (the time must in general be long enough for transient components of the applied magnetic fields to decay to zero), an intense 90° "read" pulse is applied. The ensuing FID is recorded and Fourier transformed. This resultant line shape will not in general display the local saturation behaviour as depicted in FIG. 6(b) for the method (v) experiment. Because of the gradient switching, the effects of the saturated portion of the sample are spread across most of the observed spectrum. However, the desired signal corresponding to the spin density distribution along the irradiated slice may be directly observed by looking at the difference signal between the line shape for the unirradiated and irradiated specimen. That is to say in this method the desired spin distribution is measured in a complementary manner to that of method (v) by observing the changes of the line shape due to local saturation of parts of the sample.

By "tailoring" the spectral components of a burst of r.f. pulses, the burst will selectively affect certain areas of the nuclear spin spectrum while leaving other areas unperturbed. When a nuclear spin is in a magnetic field gradient, its resonant (Larmor) frequency is directly related to its spatial position. Hence the combination of tailored excitation and magnetic field gradients, applied at appropriate times and in appropriate directions, allows one to determine the spin density (or other of their properties such as $T_1$ and $T_2$) at any point or region in the sample, without performing lengthy calculations.

The sequence of operations for one form, Method (ii), of tailored excitation will now be discussed in some detail. The operations are indicated schematically in FIG. 8.

The gradient $G_x$ is initially along the $x$ direction. Spins within the interval $x_o$ to $x_o + \Delta x$ resonate with Larmor frequencies of $f_1$ to $f_2$. It will now be indicated how to specialize to this slice S of width $\Delta x$ (see FIG. 1) and then to proceed further to even smaller regions of the sample. The spins are first irradiated by a tailored excitation pulse sequence which nutates all spins outside $f_1$ to $f_2$ by 90° or odd multiples thereof. Spins inside this frequency interval are unaffected. The unwanted spins are now in the $xy$ plane of the rotating reference system and dephase with a time constant $c_x$ of approximately $(\gamma G_x L_x)^{-1}$. The sample dimensions in the $x,y,z$ directions are $L_x$, $L_y$ and $L_z$. The differentiated spins are still aligned along the $z$ direction. Then at a time greater than $c_x$ but much less than $T_1$ the direction and perhaps magnitude of the gradient is switched from $G_x$ to $G_y$ and a second tailored excitation is performed. Hence the desired spins lie within a new frequency interval $f_3$ to $f_4$, corresponding to $y_o$ and $y_o + \Delta y$. After a time $c_y$ greater than $(\gamma G_y L_y)^{-1}$ the signal from these unwanted spins, with frequencies outside the range $f_3$ to $f_4$, has decayed. The gradient is now switched from $G_y$ and $G_z$ and a single intense $\pi/2$ "read" pulse is applied. The signal that is read out following this pulse arises from the region $$x_o < x < x_o + \Delta x$$

$$y_o < y < y_o + \Delta y$$

$$0 < z < L_z$$

In the limit as $\Delta x$ and $\Delta y$ are very small, the Fourier transform of the signal that is read out is directly proportional to the spin density along the line $x_o, y_o$ $0 < z < L_z$. The entire procedure is then repeated with different values of $f_1$ and $f_2$, $f_3$ and $f_4$ to obtain the spin density elsewhere in the sample.

Essentially this tailored excitation method differs from tailored saturation in that the former produces the desired magnetization within a time of approximately $(\gamma G_x \Delta x)^{-1}$ whereas the latter requires a time comparable to $T_1$ or $T_2$.

The tailored excitation pulses are routed through the low power r.f. channel B of FIG. 3 while the final "read" pulse uses the high power channel A.

FIG. 9 shows a simple demonstration of one aspect of a tailored excitation sequence, Method (ivb). An 8 mm cylindrical sample has been irradiated so that spins within a narrow slot (parallel to the cylinder axis) are nutated by about 90° and other spins are unaffected. The figure shows at (a) the Fourier transforms of the signal following a single intense 90° pulse, from the entire sample and also at (b) of the signal immediately following the tailored excitation. This procedure has specialized to a slot of 0.35 mm width from an 8 mm diameter tube.

Method (iv) has certain advantages over the procedure described earlier in method (ii). Here the desired spins are selectively irradiated and undergo a net 90° or 270° nutation and unwanted spins are unperturbed, contrary to Method (ii). (One could also perform a simple excitation experiment - Method (iv)b where the tailored r.f. burst is replaced by a long duration low level 90° or 270° r.f. pulse. A pulse of duration D has a spectral width of approximately $D^{-1}$. Since some of the r.f. power is contained in the sidebands, displaced by roughly $D^{-1}$ from the carrier frequency, the spatial definition of the slot is not as precise as in tailored excitation method (iv)b).

An intense 180° pulse is applied nutating the unwanted spins to the $-z$ direction. These then relax from some value of magnetization $-M'(O)$ back towards the equilibrium value $+M'(O)$ with a time constant of $T_1$. At the time $t = T_1 \ln 2$ the magnetization from the unwanted spins is zero, whereas the magnetization from the desired spins has partially relaxed and is not zero. At this instant the spins may be inspected by an intense $\pi/2$ "read" pulse or the process may be repeated using the gradients $G_y$ and $G_z$ further specialize to a narrow column. Details of the specialization to the $x_o$ plane are shown in FIG. 10.

FIG. 11 shows illustrative results for one portion of the above described tailored excitation experiment. The procedure used is just as outlined in FIG. 10. The signal following a single intense $\pi/2$ pulse is shown at (c). The signal obtained from a slot in the sample is shown at (d). The data show that the tailored excitation has specialized to a slot of width 0.8 mm from a sample of 4.5 dimension.

The desired Fourier spectrum of a tailored excitation is entered into a computer. This spectrum is then Fourier transformed on line by a modification of the version of the Cooley-Tukey fast Fourier transform algorithm described in Comm. of the A.C.M. 11, 703(1968).

The resultant amplitudes are then converted into pulse widths by suitable software (see FIG. 12). The desired spectrum (e) is entered into the computer and a software routine converts the amplitude (f) of the Fourier transform of (e) into pulse widths (g) and trigger pulses (h) which cause the phase modulator to alter the r.f. carrier phase by 180°. The pulses (g) and (h) then drive the r.f. transmitter to produce the tailored excitation; the effective r.f. modulation is shown in (i). The spacing between pulses is set to 18 $\tau_o$, where $\tau_o = 1.6$ $\mu$sec is the cycle time of the computer. Pulse widths of 0 to 16 $\tau_o$ are used and a maximum of 156 pulses is available. Negative r.f. pulse amplitudes are generated by changing the phase of the carrier by 180° by triggering the phase modulator B2 of FIG. 3.

With this arrangement a spectrum of 17.2 kHz width may be irradiated in increments of 67.8 Hz.

A simple modification will allow use of a programmable pulse controller C; with this, a greater frequency range may be irradiated. (For simplicity the apparatus diagram, FIG. 3, has shown that a programmer is used.)

Although most experiments of this type will require irradiating all but a narrow region of the spin spectrum, the tailored excitation method outlined above is a very flexible tool, allowing irradiation of virtually any complex region of the spin spectrum.

Advantages of the selective irradiative processes described above are:

i. Lengthy computer calculations are not required. Other NMR imaging techniques form one-dimensional projections of the entire sample from different angles and require a major computer calculation to unscramble the image.

ii. The region of interest in the sample may be examined in detail without requiring that a high resolution image of the sample is first obtained. Hence no time is wasted if only a small region is to be mapped.

iii. The image may be selectively magnified in one or two dimensions since the magnification depends on the strength of the applied magnetic field gradient. This feature is lacking in conventional optical, electron or x-ray microscopy.

iv. The technique forms images of samples containing nucleii of non-zero nuclear spin, such as protons, fluorine, carbon 13, etc. The method looks at one nuclear species at a time and so one can form a map of, say, the proton content of a sample and then repeat the imaging for the carbon 13 content.

v. In addition to producing a spin density map, other spatially dependent characteristics of the nuclear spin system may be imaged, such as $T_1$ and $T_2$.

Under some circumstances combinations of the methods might be used, e.g. Method (i) or (v) for the $x$ dimension and Method (ii) for the $y$ dimension.

As an alternative to the methods described above the method set out below can be used. The sample is placed in a static magnetic field $H_o$ which defines the z-axis of quantization of the nuclei. Three successive stages of irradiation and signal observation (Z), (Y) and (X) then follow.

Z. A field gradient $G_z$ is switched on and a selective excitation pulse applied so as to saturate the nuclear magnetization within the sample above and below a layer of thickness $\Delta z$ at $z_o$ from the origin. FIG. 13 shows this, the saturated portions of a specimen being shown shaded. The unshaded layer $\Delta z$ comprises undisturbed spins in equilibrium with the static magnetic field $H_o$.

Y. The layer $\Delta z$ of undisturbed spins as shown in FIG. 14 are then concentrated on. The gradient $G_z$ is quickly replaced by a new gradient $G_y$ along the y-axis and a second selective excitation pulse is applied, but only to those spins within $\Delta y$ at $y_o$ in the undisturbed slice. This defines a narrow strip within the original layer $\Delta z$.

X. At the end of the excitation pulse, the gradient is quickly switched from $G_y$ to $G_x$. The free induction decay from those spins in the volume element $x\Delta y \Delta z$ is observed and Fourier transformed to give a spin density distribution along the volume element. If $\Delta y$ and $\Delta z$ are small, this spin density distribution is the line density $\rho(x,y_o,z_o)$.

During the selective irradiation process, it may be more convenient to use different gradients $G_z$ and $G_y$. For the 'read out', $G_x$ may also be adjusted to a convenient value.

The switching sequences in the three stages (Z), (Y) and (X) are shown in FIG. 15. The initial selection process (Z) may be repeated each cycle, thus redefining the slab of thickness $\Delta z$, or less frequently if desired. The 'refresh' rate will depend on the relaxation time of the saturated (shaded) regions of the specimen, as in FIG. 13. The actual sequence of events would thus be written as a cycle, $(Z, Y(n), X)_n$ where $n$ is an integer. That is to say, the irradiation process (Z) and the 'read out' process (X) are repeated each cycle, but the selective excitation process $Y(n)$ is varies with each cycle. This variation corresponds to generating a sweep pattern which rapidly scans the layer from $y_o = 0$ to $y_o = Y$. (Y is the full specimen dimension along the y-axis). It is this feature which makes the sequence attractive because it means that a complete scan of the sample can be obtained very rapidly, and in particular in a time less than the spin-lattice relaxation time $T_1$ of the specimen.

Of course, if it is desired to repeat the complete scan, it is necessary to wait a time $T_1$ for the magnetization in the first slot, $\Delta y$ at $y_o = 0$, to recover. However, estimates indicate that the time to produce a complete scan in biological tissue (it obviously depends on $n$, typically take $n = 128$) is approximately 1.0sec. By the time one complete scan is made, the system will automatically be ready for a second scan.

One further point concerning the initial process (Z). In certain circumstances it may be better to define cycles containing one (Z) and $m$ (integer) subcycles of $(Y(n,m))$ and (X). Such a cycle would be written $$(Z - (Y(n,m),X)_m)_n$$

This cycle is useful since the priming process or refresh rate may be required less frequently in order to keep the initially saturated regions of the specimen saturated. Such cycles would allow more resolution per scan for the same scan time. Of course, the scan repetition rate would be slowed down through the implied increase of the spin lattice relaxation time.

In the tailored excitation sequence described above, the initial preparation of the spin system in $G_z$ involves r.f. pulses which nutate most (though not all) of the spins through 90°. Precisely which spins are affected will depend on the magnitude of the field gradient and the spectral distribution of the perturbing r.f. pulse.

The excitation pulses are made spatially selective by modulating or tailoring the pulse shape so that its spectral distribution function has the desired form. The tailoring function is derived from the Fourier transform of the desired spectral distribution function and is used to directly modulate the pulse r.f. carrier wave.

2.3.1 pulse width modulation.

One method of tailored excitation is to modulate the pulse widths of a pulsed r.f. signal. The amplitude variations of the time domain data are used to modulate the width of a regular sequence of r.f. pulses of constant amplitude. Negative excursions in amplitude cause a 180° phase shift of the carrier wave.

At first sight, this method seems satisfactory, since it is relatively easy to generate r.f. pulses of constant amplitude and varying width in non-linear r.f. amplifiers and gates. However, analysis of the spectral distribution corresponding to a general pulse width modulation function, shows that in general it does not correspond to the original spectral distribution function. Indeed, most of the r.f. power goes into undesirable harmonics and sidebands which are generated about the carrier frequency.

A simpler method is to directly amplitude modulate the carrier wave, preferably by single sideband amplitude modulation.

If the cosine transform of the desired spectral distribution function is used to amplitude modulate the r.f. carrier wave, the resulting r.f. spectral distribution is a doublet about the carrier frequency. However, one or other of the pair may be supressed by in addition amplitude modulating with the sine transform a second carrier wave shose phase is in quadrature with the first.

In practice, for the simple cosine transform, the undesirable image function will produce a relatively small effect on the spin system for large frequency offset of modulation function.

To irradiate a narrow spectrum as for example in $t_y$(FIG. (15)) the required r.f. level will be low. This is contrasted with the initial saturation process in $t_z$, where the spectral distribution is broad, since all but a small region of the specimen is irradiated. The ratios of the r.f. amplitudes for equal $G_z$ and $G_y$ could typically be 100. However, if $G_z$ is made smaller than $G_y$ a more favourable ratio obtains. Even so, the range of r.f. amplitude required to describe the (Z) irradiation pattern is larger than that for (Y), and imposes severe requirements on the linearity of the r.f. gates and amplifiers.

FIG. 16 is a schematic diagram of nuclear magnetic resonance apparatus embodying the invention.

Low level r.f. is fed from a frequency synthesiser 10 running at 15.0 MHz through a 180° phase modulator 11 to a quadrature hybrid splitter 12. Both the zero phase output or x-channel and the quadrature phase output or y-channel are fed through binary attenuators 13 and 14 which are controlled from a computer 15. A suitable computer is a Honeywell H316. Each attenuator consists of a five port power splitter at its input. Each of the four output ports is fed through a high attenuation r.f. transmission gate and preset attenuator. The attenuation values in the four channels are 0 dB, 6 dB, 12 dB, and 18 dB. The four channels are finally combined in a broad band adder to give a single output.

The binary attenuator outputs of both x and y channels are combined in a three way combiner 16 and fed through avariable attenuator $A_1$ to a broad band amplifier 17. Attenuator $A_1$ can also be a binary attenuator and may be controlled from computer 15 to extend the power range of the r.f. signals.

An alternative r.f. route is also provided from the synthesiser via transmission gate G to $A_1$. The gate is controlled by the pulse generator P which receives its controlling trigger from the computer 15. This enables short r.f. pulses of high power to be produced which are necessary in the spectrometer alignment and calibration procedures.

The amplifier 17 is linear over a wide range and the 16 stepped r.f. levels from the binary attenuators 13 and 14 are arranged to span this power range.

Attenuator $A_2$, which may also be a binary attenuator and may be controlled from computer 15, is used to vary the final power level delivered to the probe 18. R.f. matching is used throughout the transmitter and receiver systems.

Nuclear signals from probe 18 are amplified first in a low noise pre-amplifier 19, the output of which is further amplified and detected relative to the reference input, in a phase sensitive detector 20. The detected output signal is converted to digital form in an analogue-to-digital converter (ADC). This is interfaced directly to computer 15 via an input/output highway 21, so that digital conversion and transfer of data are effected on receipt of an internal command instruction in the computer.

The probe, FIG. 17 is a Q switched device which comprises a series tuned circuit in which the inductance L forms the sample coil and is common to both the transmission and reception modes. Series crossed diodes $D_1$ isolate the transmitter from the probe during signal reception. The nuclear signal is fed through a matching resistor R2 via a 5:1 broad band transformer and a quarter-wavelength line to the pre-amplifier 19. Parallel crossed diodes $D_2$ at the pre-amplifier input protect it during the transmission of the r.f. pulses. Resistor R1 matches the probe to the transmitter. This circuit has the advantage of simplicity over most other probe circuits since it uses only one tuning capacitor C for both matching and tuning.

To improve r.f. inhomogeneity, the sample coil L is wound over an insulated copper foil flux guide made in the form of a cylinder from thin copper sheet.

The probe assembly is surrounded by gradient coils which in general produce magnetic field gradients $G_x$, $G_y$ and $G_z$.

The current flowing though gradient coils is controlled by the switch S1, which switches on a current amplifier $A_x$, $A_y$ or $A_z$, so directing current from one coil to another. In general the currents will be of different magnitudes and this produces different field gradients. If necessary two or more gradient coils can be energised simultaneously.

The computer is modified by providing buffered and gated outputs from bits 11–16 of the accumulator or A-register. On receipt of the relevant internal command instruction, all gates are opened. Bit patterns corresponding to the particular pulse sequence required are loaded sequentially into the A-register internally via software control. Since the H316 is a synchronous computer, the timing of all instructions is coherent and occurs in units of the machine cycle time, i.e. 1.6 sec.

In the experiments described, bits 13–16 control the binary attenuator, while bit 12 controls the gradient switching via the switch S1 and bit 11 controls the carrier wave phase reversals via the 180° phase modulator.

During data processing or other operations of the computer when control pulses are not required, the A-register outputs are switched off. This is to prevent spurious control pulses which will occur since during normal working most bit manipulations are performed in the accumulator register.

A control console houses a block of sense switches each one of which can be tested or sensed like a normal peripheral device. This process occurs on receipt of an internal command instruction via software. This instructs the computer to either ignore or perform the following programme instruction, depending on whether the particular sense switch is set or reset. In this way the various sense switches are used to route the programme during its execution to other parts of the software routine.

The display interface operates in a one or two dimensional mode on receipt of the relevant computer instruction.

In the one dimensional operation, blocks of memory (64–512 words) are output by an internal software routine. Each word is converted to an analogue voltage in the display interface and used as the y deflection of a monitor oscilloscope. A 12 bit binary counter is incremented on completion of each word transfer. This count is converted to an analogue voltage in a 12 bit DAC and used to produce the x deflection of the data point on the visual display.

In the two dimensional mode, memory blocks of $¼(64)^2$, $¼(128)^2$, and $¼(256)^2$ words are output via an internal software routine. Each 16 bit word output is temporarily placed in a 16 bit buffer store. Before receipt of the next computer word, the word in the buffer store is strobed out in four blocks each of four bits. The output of each four bit word increments a counter which, through a DAC produces the x deflection drive of the display oscilloscope. A second counter counts the end of each line of data points and through a secnd DAC gives the y deflection, thus generating a square television raster. The magnitude of each four bit word is rapidly converted to analogue form and used to directly modulate the intensity of the display oscilloscope's electron beam, thus generating a television type picture. The display unit must have a linear beam intensity modulation facility. With a four bit word output rate of about 3.0μsec per point, this gives little flicker, even for 256² arrays.

For calibration and alignment pulse generator P in FIG. 16 is connected in place of the binary attenuator and used to generate short intense 90° pulses in the sample coil. The sample is either paramagnetically doped water or mineral oil in the form of a cylinder whose cylindrical axis lies along the z direction. The absorption line of this shape sample in a linear field gradient $G_x$ or $G_y$ has a semi-circular appearance the base width of which, together with the actual diameter of the cylinder enables a direct calibration of the field gradient. This process is repeated for both gradients $G_y$ and $G_z$, although for $G_z$, the sample axis is aligned along either x or y. The 90° pulse response also allows the picture span to be brought within the date display range simply by centring the projection data and adjusting its width via the field gradient and/or the data point spacing.

The alignment procedure consists of first setting the correct r.f. irradiation level and then the receiver phase.

The r.f. level is set by irradiating the specimen with a tailored excitation sequence corresponding to the narrowest spectral distribution function i.e. one point in the frequency domain. The frequency offset is chosen so that a narrow slot through the centre of the sample is irradiated. The response to this irradiation in a constant gradient $G_y$ (no gradient switching) is Fourier transformed and the resulting narrow spike is maximized for the lowest r.f. power possible. This corresponds to a 90° nutation pulse. One can also check this by repeating without the gradient. In this case, the whole sample will contribute to the signal if the static magnetic field $H_o$ is adjusted to counter the frequency offset of the selective pulse.

Finally, the full experiment is performed in switched gradients but at constant frequency offset. The signal profile corresponding to a narrow slot across the middle of the sample cross-section is displayed and the r.f. reference phase adjusted to give a symmetric and positive absorption line. A preliminary trial data average of the profile is also performed which enables the data scaling to be set so as to bring the averaged data variations within the full 16 level intensity range of the visual picture display.

We claim:

1. Nuclear magnetic resonance apparatus comprising means for applying a static magnetic field to a sample along one axis, means for applying a magnetic field gradient along said one axis to said magnetic field which varies along said one axis, means for applying a gradient to said magnetic field along said one axis and which varies in at least one direction orthogonal to said one axis, means for applying radio frequency signals having selected frequency components to such sample to selectively excite a predetermined region of said sample to which a predetermined gradient has been applied, means for switching the said magnetic field gradients in sequence simultaneously with the application of said RF signals so as to preferentially excite only certain regions of the sample associated with said predetermined gradients and leave other regions effectively unexcited, and means for enabling the free induction decay signal from the sample to be read out.

2. The apparatus as claimed in claim 1 in which the means for applying radio frequency signals to the sample include means for selecting first frequency components which in combination with a simultaneously applied magnetic field gradient saturates spins in a sample except those in a slice extending in a plane perpendicular to the direction of that field gradient.

3. The apparatus as claimed in claim 2 in which the means for applying radio frequency signals to the sample includes means for selecting second frequency components which in combination with a simultaneously applied magnetic field gradient saturates only those spins in a sample lying in a slice extending in a plane perpendicular to the direction of that magnetic field gradient.

4. The apparatus as claimed in claim 3 in which the means for switching the magnetic field gradients operates to switch a first field gradient when the r.f. signal comprises said first frequency components and operates thereafter to switch a second field gradient orthogonal to the first field gradient when the r.f. signal includes said second frequency components, whereby to saturate only those spins lying in a strip in the said slice.

5. The apparatus as claimed in claim 4 in which the means for switching the magnetic field gradients operates to switch a third field gradient orthogonal to both the first and second magnetic field gradients during which time the free induction decay signal from the sample is read out.

6. The apparatus as claimed in claim 4 in which the means for switching the magnetic field gradients operates to switch the magnetic field gradients successively in first, second and third orthogonal directions and the means for applying radio frequency signals operates during said first and second periods.

7. The apparatus as claimed in claim 6 in which the means for switching the magnetic field gradients operates to switch the gradients cyclically in said second and third orthogonal directions and in which in each cycle the means for applying radio frequency signals applies different selected frequency components to saturate spins lying in different strips in the said slice.

8. The apparatus as claimed in claim 1 in which the means for applying radio frequency signals having selected frequency components comprises a radio frequency generator and an amplitude modulator for the output from the radio frequency generator.

9. The apparatus as claimed in claim 8 in which the amplitude modulator comprises a switched attenuator.

10. An apparatus as in claim 1, wherein said gradients are linear.

* * * * *